United States Patent [19]

Ooishi et al.

[11] 4,379,997
[45] Apr. 12, 1983

[54] POWER AMPLIFIER

[75] Inventors: Minoru Ooishi, Yokohamashi; Teruji Mochizuki, Fujisawashi; Yutaka Suzuki, Yokohamashi, all of Japan

[73] Assignee: Tokyo Shibaura Denki Kabushiki Kaisha, Kawasaki, Japan

[21] Appl. No.: 222,739

[22] Filed: Jan. 5, 1981

[30] Foreign Application Priority Data

Feb. 8, 1980 [JP] Japan .................................. 55-14343

[51] Int. Cl.³ .............................................. H03F 3/04
[52] U.S. Cl. ................................. 330/298; 330/207 P
[58] Field of Search ..................... 330/207 P, 297, 298

[56] References Cited

U.S. PATENT DOCUMENTS 3,735,203  5/1973  Fujie et al. ...................... 330/207 P
4,288,755  9/1981  Sakai .................................... 330/298

FOREIGN PATENT DOCUMENTS 1426089  2/1976  United Kingdom .

OTHER PUBLICATIONS

"Einfache elektronische Oberlastsicherung fur Transistor-Gegentaktverstarker" Funkschau 1971, p. 184.
1,168,973 Transistor amplifier stage, C: Electricity, Electronics, Communications–p. 2, German 30.4.64, vol. 4, No. 22.

Primary Examiner—James B. Mullins
Assistant Examiner—Gene Wan
Attorney, Agent, or Firm—Finnegan, Henderson, Farabow, Garrett & Dunner

[57] ABSTRACT

A power amplifier which has a muting circuit bringing the power amplifier into a muting condition when an excessively large input signal is applied. The power amplifier comprises a preamplifying stage and a power amplifying stage. The preamplifying stage includes at least one transistor for driving the power amplifying stage. The collector of the transistor is coupled to one power source terminal. The emitter of the transistor is coupled to the other power source terminal through an electronic switch, and to the first power source terminal through a resistor. The electronic switch selectively connects the emitter of the transistor to one of the power source terminals.

12 Claims, 4 Drawing Figures

POWER AMPLIFIER

BACKGROUND OF THE INVENTION

1. Field of the Invention

This invention relates to a power amplifier, and more particularly to a power amplifier which has a muting circuit to drive the power amplifier into a muting condition when an excessively large signal is supplied to it.

2. Description of the Prior Art

One of the problems in the design of transistorized power amplifiers is that a surge current of extremely large amplitude flows through the power transistors and load immediately after the power amplifier is brought into operation. This results in noise or other undesired phenomena in the load, and, sometimes, in destruction of the power transistors and the load. Another problem is than an excessively large input signal causes the power transistors or the load to be overloaded, possibly causing their destruction.

The use of muting circuits is known in the art of designing power amplifiers to prevent the occurrence of undesired noise or other phenomena and the destruction of the power transistors and the load. This is accomplished by inserting an electronic control switch in the current path of an amplifying transistor located before the power transistors. In such designs, the electronic control switch does not completely render the amplifying transistor dead. Thus part of the input signal passes through the amplifying transistor to the power transistors when a large signal is supplied, causing noise or other undesired phenomena, although at a relatively lower level than when the electronic control switch is not used.

SUMMARY OF THE INVENTION

Accordingly, an object of the present invention is to provide a power amplifier having a muting circuit which completely suppresses excessively large input signals.

A further object of the present invention is to provide a power amplifier having a muting circuit which completely suppresses an excessively large input signal for a predetermined period after the amplifier is brought into operating condition.

Another object of the present invention is to provide a power amplifier having a muting circuit which completely prevents overloading of the amplifier.

Still another object of the present invention is to provide a power amplifier having a muting circuit which may suppress an undesired change in potential at an output terminal of the amplifier during a muting condition.

In the preferred embodiment of the present invention desired herein, the muting circuit for a power amplifier is provided with a power amplifying stage; a preamplifying stage for driving the power amplifying stage which includes a transistor having a base, a collector and an emitter, the base being coupled to an input circuit means, the collector being coupled to the power amplifying stage and a first power source terminal via a collector load means, and the emitter being coupled to a second power source terminal; an electronic switch means selectively connecting the emitter of the transistor of the preamplifying stage to either one of the first power source terminal or the second power source terminal; and a control circuit means for controlling the switch means in accordance with a muting signal.

Other objects, features and advantages of the present invention will become apparent to persons skilled in the art from a study of the following description taken in conjunction with the accompanying drawings in which:

DESCRIPTION OF THE PREFERRED EMBODIMENTS

Figure 1:
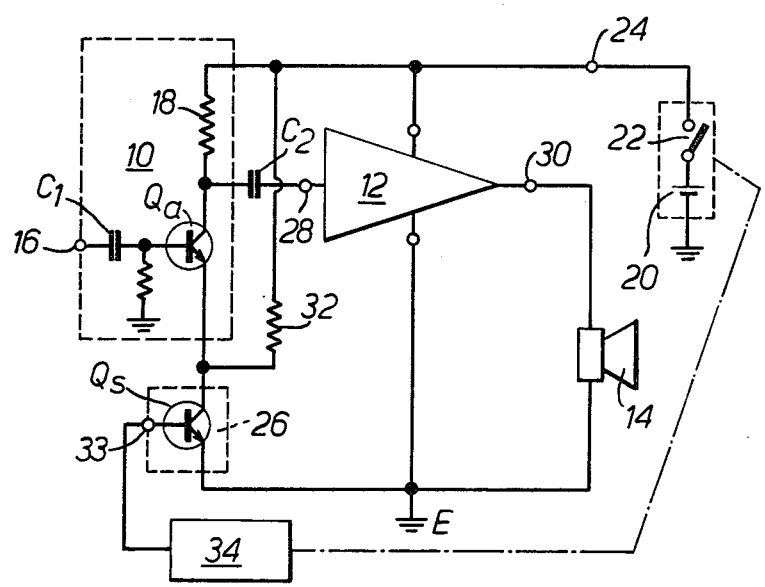
FIG. 1 shows the muting circuit of the present invention in use with a power amplifier.

The present invention will be described in detail with reference to the accompanying drawings. Throughout the drawings, like reference numerals will be used to designate like or equivalent portions, for the sake of simplicity of explanation.

Referring now to FIG. 1, a power amplifier with muting circuit according to the present invention is shown. Preamplifying stage 10, power amplifying stage 12 and load means, for example, loudspeaker 14, are connected in turn in the circuit. Preamplifying stage 10 includes a transistor $Q_a$. The base of transistor $Q_a$ is connected through coupling capacitor $C_1$ to input terminal 16 of the preamplifying stage 10 for receiving the input signal to be amplified. The collector of transistor $Q_a$ is coupled to one end of collector-load resistor 18, the other end of which is connectible to power source means 20, through terminal 24 and power switch 22. The emitter of transistor $Q_a$ is connected to ground potential E via an electronic switch 26 which is described later in detail.

An input terminal 28 of power amplifying stage 12 is connected through coupling capacitor $C_2$ to the collector of transistor $Q_a$ in preamplifying stage 10 for receiving the signal, which is amplified to some extent by preamplifying stage 10. A signal power amplified (not shown) comprises the output of amplifying stage 12 and connected to loudspeaker 14 through output terminal 30 to drive loudspeaker 14.

Electronic switch 26 includes switching transistor $Q_s$. Switching transistor $Q_s$ is inserted between the emitter of transistor $Q_a$ and ground potential E by the connection of its collector to the emitter of transistor $Q_a$, and the connection of its emitter to ground potential E. Also, the collector of transistor $Q_s$ is connected to power source terminal 24 via a resistor 32. The base of transistor $Q_s$ is coupled to an input terminal 33 of electronic switch 26, and a control circuit 34 is connected to input terminal 33 of electronic switch 26 for applying a control signal to the base of transistor $Q_s$.

A description will now be given of the operation of the circuit shown in FIG. 1. Immediately after power switch 22 is closed, a pulse signal occurs on input terminal 16 of preamplifying stage 10 and is applied to the base of transistor $Q_a$. Control circuit 34, which is interlocked with power supply means 20, supplies a control signal to the electronic switch 26. The control signal maintains transistor $Q_s$ in ON condition, after a predetermined period of time T expires following closing of power switch 22. After power switch 22 is closed and until predetermined period of time T expires, control circuit 34 applies no signal to the base of transistor $Q_s$, and consequently transistor $Q_s$ is biased to the OFF condition. Accordingly, after power switch 22 is closed, the emitter potential of transistor $Q_a$ is maintained at the same potential as its collector by means of resistor 32 connected to the power supply 20. Therefore, transistor $Q_a$ remains in complete OFF condition and prevents the passing of the pulse signal through transistor $Q_a$ to power amplifying stage 12, during the time transistor $Q_s$ is in OFF condition.

Accordingly, the entire power amplifier is maintained in muted condition during the predetermined period of time after power switch 22 is closed so that undesired phenomena such as noise from loudspeaker 14 or destruction of loudspeaker 14 and the possible distinction of the loudspeaker or power transistors included in power amplifying stage 12 are prevented.

The control signal applied by control circuit 34 to the base of transistor $Q_s$ after expiration of the predetermined period of time T drives transistor $Q_s$ into the ON condition after the power source current is settled to normal operating condition. As a result, the emitter potential of transistor $Q_s$ is driven through the conduction of transistor $Q_s$ to ground potential and transistor $Q_a$ is rendered operative to amplify the input signal and supplies it to power amplifying stage 12. At this time, transistor $Q_a$ is driven to ground through transistor $Q_s$ and is thereby, in effect, disconnected from the power source. The power amplifier 12 thus operates in its normal condition to amplify input signals and apply them to loudspeaker 14.

In addition, the power amplifier may be protected from overload conditions. In this connection, control circuit means 34 is interlocked to an overcurrent detecting means (not shown) included in power amplifying stage 12. During normal operation, the control circuit means 34 applies a control signal to the base of transistor $Q_s$ to drive it into conduction. When an overcurrent flows through the power transistors and loudspeaker 14, due to an excessive input signal or a short-circuit, control circuit means 34 removes the control signal from the base of transistor $Q_s$ to bias it to the OFF condition. Thus ground potential is removed from the emitter of transistor $Q_a$, and its emitter is, in effect, again connected to the power supply 20 through resistor 32. Accordingly, transistor $Q_a$ is biased to the complete OFF condition and prevents the signal from passing through power amplifying stage 12. After the overcurrent is removed, the overcurrent detecting means detects the removal, and the control circuit means 34, which is interlocked with the overcurrent detecting means, again applies the control signal to the base of transistor $Q_s$. As a result transistor $Q_s$ is biased to the ON condition, and transistor $Q_a$ is also driven to the ON condition to amplify the input signals and apply them to power amplifying stage 12.

Figure 2:
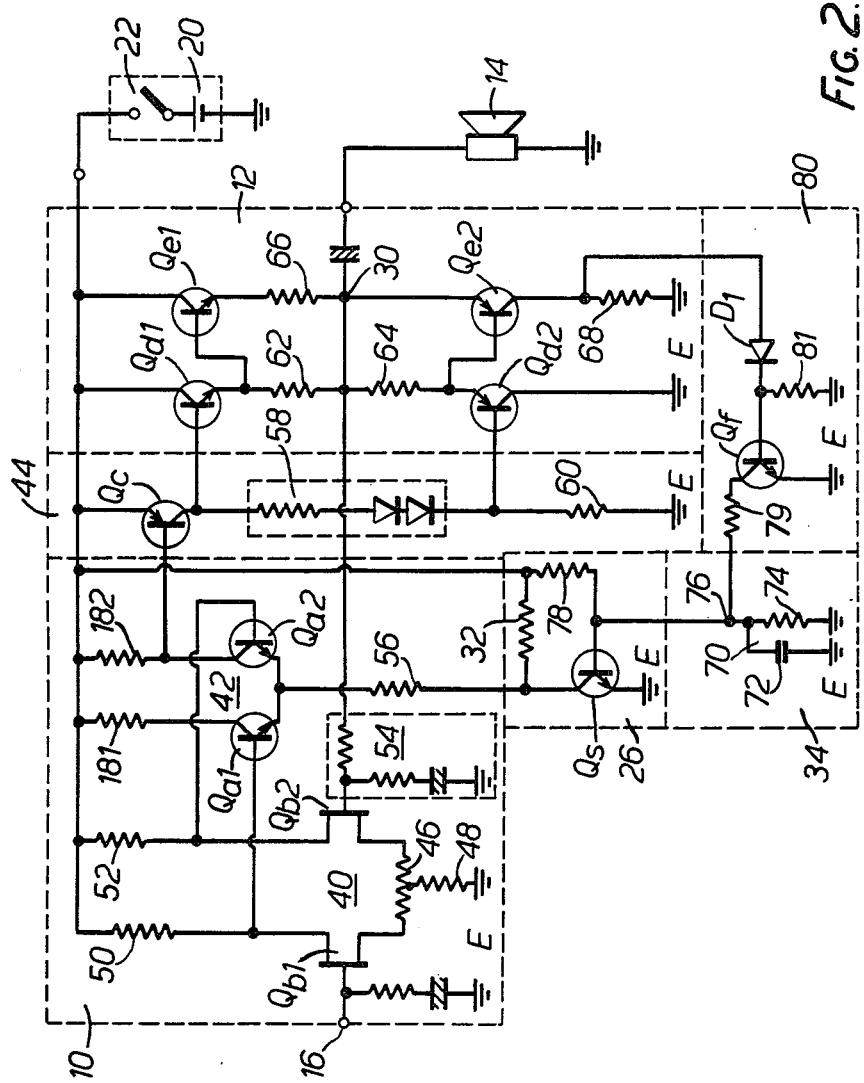
FIG. 2 is a circuit diagram of another power amplifier with a muting circuit according to the present invention.

FIG. 2 shows a circuit diagram of a direct coupled quasicomplementary push-pull type power amplifier according to the present invention.

A preamplifying stage 10 includes a first differential amplifier 40, a second differential amplifier 42 and a driven amplifier 44. First differential amplifier 40 has a pair of field-effect transistors (FETs) $Q_{b1}$ amd $Q_{b2}$, the sources of which are connected to each other through a resistor 46, which is in turn connected at its midpoint to ground E through a resistor 48. The gate of FET $Q_{b1}$ is coupled to input terminal 16, and the gate of FET $Q_{b2}$ is coupled to output terminal 30 of power amplifying stage 12 through a feedback circuit 54. The drains of FETs $Q_{b1}$ and $Q_{b2}$ are respectively connected through resistors 50 and 52 to power supply 20.

Second differential amplifier 42 comprises a pair of NPN transistors $Q_{a1}$ and $Q_{a2}$, the emitters of which are coupled together and to ground E via a common-emitter resistor 56 and electronic switch 26, generally equivalent to switch 26 shown in FIG. 2. The collectors of transistors $Q_{a1}$ and $Q_{a2}$ are coupled to power supply means 20 through respective collector loads resistors 181 and 182. The bases of transistors $Q_{a1}$ and $Q_{a2}$ are coupled to the drains of FETs $Q_{b1}$ and $Q_{b2}$ respectively.

Driver amplifier 44 has a PNP driver transistor $Q_c$, the emitter of which is coupled to power supply means 20. The collector of transistor $Q_c$ is connected to ground E through the series connection of bias circuit 58 and collector load resistor 60. The base of transistor $Q_c$ is coupled to the collector of transistor $Q_{a2}$.

The power amplifying stage 12 includes a pair of complementary transistors $Q_{d1}$ and $Q_{d2}$ and a pair of NPN power transistors $Q_{e1}$ and $Q_{e2}$. NPN transistor $Q_{d1}$ has its base coupled to the collector of driver transistor $Q_c$, and PNP transistor $Q_{d2}$ has its base connected to the collector of transistor $Q_{a2}$ through bias circuit 58. The emitters of transistors $Q_{d1}$ and $Q_{d2}$ are connected to output terminal 30 through respective emitter resistors 62 and 64. The collector of NPN transistor $Q_{d1}$ is connected to power supply means 20, and the collector of PNP transistor $Q_{d2}$ is coupled to ground E.

NPN power transistors $Q_{c1}$ and $Q_{c2}$ have their bases respectively coupled to the emitters of complementary transistors $Q_{d1}$ and $Q_{d2}$. The collector of transistor $Q_{c1}$ is connected to power supply means 20, and its emitter is coupled to output terminal 30 through an emitter resistor 66. The collector of transistor $Q_{e2}$ is coupled to output terminal 30 and its emitter is connected to ground E through an emitter resistor 68.

Electronic switch 26 includes NPN switching transistor $Q_s$, the collector of which is connected to both emitters of transistors $Q_{a1}$ and $Q_{a2}$ through common emitter resistor 56, and to power supply means 20 through resistor 32. The emitter of transistor $Q_s$ is coupled to ground E.

Control circuit means 34 comprises a time constant circuit 70 which comprises the parallel connection of a capacitor 72 and resistor 74. One end 76 of time constant circuit 70 is connected to power supply means 20 through resistor 78, and its other end is coupled to ground E. Further, coupling network 80 which includes NPN transistor $Q_f$ is connected between end 76 of time constant circuit 70 and the emitter of downside power transistor $Q_{e2}$. Transistor $Q_f$ has a collector connected to end 76 of time constant circuit 70 through resistor 79, an emitter coupled to ground E and a base connected to the collector of power transistor $Q_{e2}$ through the rectifier circuit comprising drive $D_1$ and resistor 81. End 76 of time constant circuit 70 is coupled to the base of switching transistor $Q_s$ of electronic switch 26.

Operation of the circuit shown in FIG. 2 is generally similar to that of the circuit of FIG. 1 as will now be described. When power switch 22 is closed, the potential at end 76 of time constant circuit 70 gradually increases because of the charging of capacitor 72. Accordingly, switching transistor $Q_s$ is maintained in the OFF condition until the potential at end 76 rises to the voltage sufficient to bias transistor $Q_s$ into the ON condition.

Thereby, the potential of power supply means $2_2$ is applied to the emitters of transistors $Q_{a1}$ and $Q_{a2}$ through resistors 32 and 56, so that both transistors $Q_{a1}$ and $Q_{a2}$ of second differential amplifier 42 are driven to complete OFF condition and prevent the passing of signals applied to input terminal 16 when power switch 22 is closed. As a result, the power amplifier is maintained in muted condition so that undesired phenomena such as the occurrence of noise from loudspeaker 14, and the destruction of loudspeaker 14 or power transistors $Q_{e1}$ and $Q_{e2}$, are prevented.

When the base potential of switching transistor $Q_s$ rises to a sufficient voltage, transistor $Q_s$ turns into the ON condition and ground potential is applied to the collector of transistor $Q_s$. Thus, second differential amplifier 42 is biased in normal operating condition and operates to amplify the signal from first differential amplifier 40 and transmit the amplified signal to driver amplifier 44. As a result, the power amplifier operates in normal condition. At this time, the common emitter potential of second differential amplifier 42 is electrically separated from power source 20 because the end of resistor 32 coupled to the collector of transistor $Q_a$ is at ground potential.

Further, when an overcurrent caused by excessive input signal or a short-circuit flows through power transistors $Q_c$ and $Q_{e2}$ and loudspeaker 14, the voltage across resistor 68 rises so that transistor $Q_f$ turns to ON condition, and the base potential of switching transistor $Q_s$ goes to ground potential. Accordingly, transistor $Q_s$ changes to the OFF condition and drives second differential amplifier 42 into the non-operating condition or OFF condition. The input signal power amplifying stage 12 is thereby intercepted until the overcurrent condition at power amplifying stage 12 is removed. The power amplifier thus operates to prevent the destruction of the power transistors and the loudspeaker due to overcurrent conditions.

Figure 3:
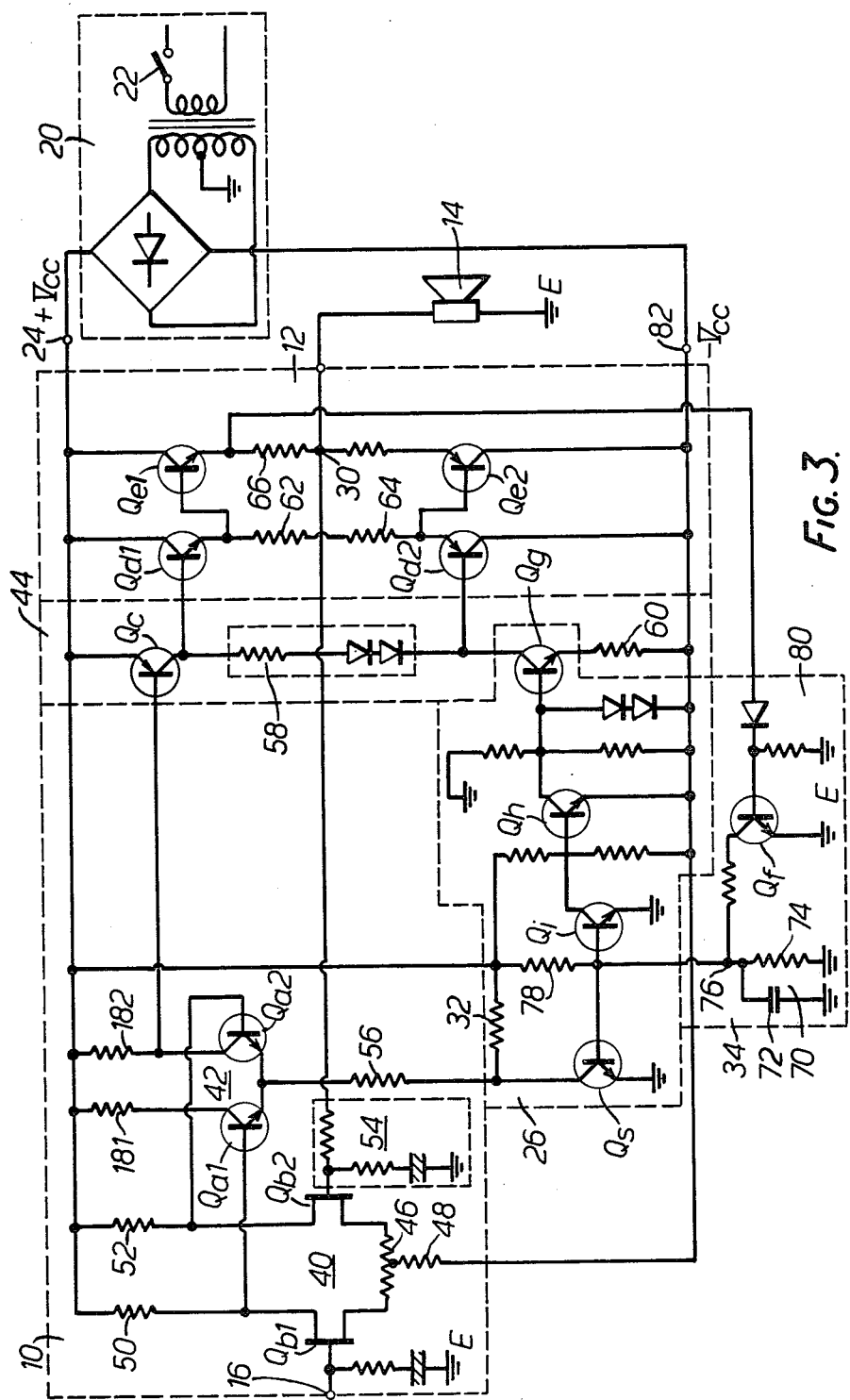
FIG. 3 is a circuit diagram of yet another power amplifier with a muting circuit according to the present invention.

FIG. 3 shows a circuit diagram of an output-capacitor-less OCL direct coupled pure-complementary type power amplifier according to the present invention. The pure-complementary design is generally equivalent to the quasi-complementary design shown in FIG. 2, and the OCL design is similar to the output capacitor coupled circuit shown in FIG. 2 except for the power supply network.

Complementary power transistors $Q_{e1}$ and $Q_{e2}$ in FIG. 3 provide a function similar to that of power transistors $Q_{e1}$ and $Q_{e2}$ in FIG. 2. Similarly, the other elements of FIG. 3, i.e., first differential amplifier 40, second differential amplifier 42, driver amplifier 44 in preamplifying stage 10, and complementary transistors $Q_{d1}$ and $Q_{d2}$ in power amplifying stage 12 operate in a manner functionally equivalent to those elements shown and described with respect to FIG. 2.

However, the power amplifier of FIG. 3 is driven by a power supply having positive and negative potential terminals, with the exception of second differential amplifier 42. Positive source voltage $+V_{cc}$ is supplied to first power source terminal 24, and negative source voltage $-V_{cc}$ is supplied to the sources of FETs $Q_{b1}$ and $Q_{b2}$ through second power source terminal 82 and resistors 46 and 48. Negative source voltage $-V_{cc}$ is further supplied to the collector of driver transistor $Q_c$ through emitter load means 60 and bias circuit 58. Negative source voltage $-V_{cc}$ is also supplied to the collectors of PNP transistors $Q_{d2}$ and $Q_{e2}$ respectively.

The emitters of transistors $Q_{a1}$ and $Q_{a2}$ are connected to ground E through common emitter resistor 56 and switching transistor $Q_s$ in electronic switch 26. In FIG. 3, electronic switch 26 further includes an NPN transistor $Q_g$ which is connected between bias circuit 58 and second power source terminal 82 and functions as collector load means 60 together with the two diodes connected between its base and emitter. The base of transistor $Q_g$ is connected to end 76 of time constant circuit 70 through NPN transistors $Q_h$ and $Q_i$.

In operation of the power amplifier shown in FIG. 3, switching transistor $Q_s$ functions similarly to transistor $Q_s$ shown in FIG. 2. If the base of transistor $Q_g$ were not be connected to control circuit 34, transistor $Q_g$ would always be biased in ON condition. Therefore, the negative potential of second power source terminal 82 existing when the power amplifier is operating in muted condition is applied to the collector of transistor $Q_g$, so that NPN transistors $Q_{d1}$ and $Q_{e1}$ are biased in the ON condition. As a result, transistors $Q_{d2}$ and $Q_{e2}$ and loudspeaker 14 are exposed to the danger of destruction, even when the amplifier is in muted condition, because of the current flowing from the second power source terminal 82 to ground E through transistor $Q_{d2}$ and $Q_{e2}$ and loudspeaker 14.

Transistor $Q_g$ is controlled by control circuit 34 together with switching transistor $Q_s$ through its base connection to time constant circuit 70 as shown in FIG. 2. Accordingly, transistor $Q_g$ goes to the OFF condition with switching transistor $Q_s$ when power switch 22 is closed, or when overcurrent flows through power transistor $Q_{e1}$ and $Q_{e2}$. The destruction of transistors $Q_{d2}$ and $Q_{e2}$ and loudspeaker 14 is thereby prevented.

Figure 4:
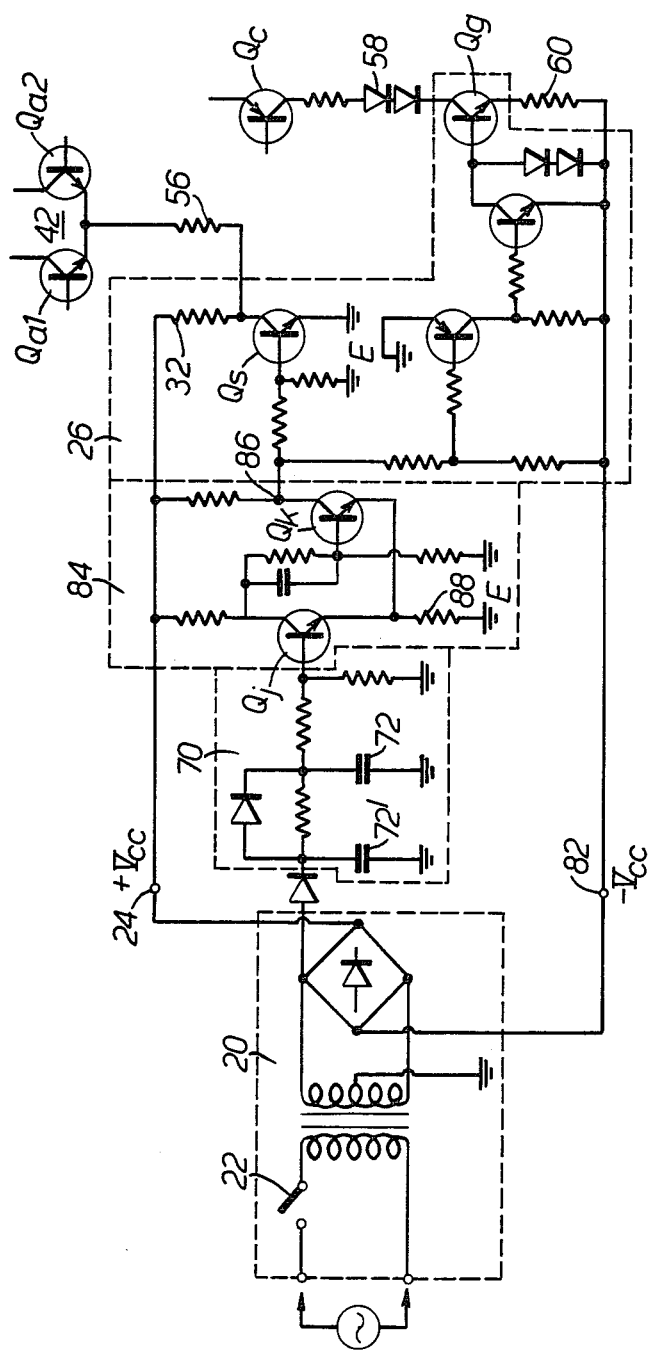
FIG. 4 is a circuit diagram of a modification of the muting control circuit means of FIG. 3.

FIG. 4 shows a circuit diagram of another control circuit modified from the control circuit shown in FIG. 3. The base of switching transistor $Q_s$ of electronic switch 26 is connected to time constant circuit 70 through Schmitt circuit 84, the output terminal 86 of which is connected to transistor $Q_g$ in driver circuit 44. The collector of transistor $Q_s$ is connected to the emitters of transistors $Q_{a1}$ and $Q_{a2}$ through common emitter resistor 56, and the collector of transistor $Q_g$ is connected to the collector of driver transistor $Q_c$ through bias circuit 58. Schmitt circuit 84 comprises a pair of cascaded connected NPN transistors $Q_j$ and $Q_k$, the emitters of which are coupled to each other and connected to ground E through resistor 88. The collector of transistor $Q_k$ is connected to transistors $Q_s$ and $Q_g$, and the base of transistor $Q_j$ is connected to time constant circuit 70.

The output level at output terminal 86 of Schmitt circuit 84 rises suddenly when the base potential of transistor $Q_j$ exceeds the turn-on level of Schmitt circuit 84, and falls when the base potential is below the Schmidt trigger turn-off level. Therefore when the charging voltage of time constant circuit 70 or the base potential of transistor $Q_j$ exceeds the turn-on level for a predetermined time after closing of power switch 22 or after removing of an overcurrent, the output level of output terminal 86 or the base potential of transistor $Q_s$ suddenly rises so that transistor $Q_s$ is immediately driven into the ON condition. On the other hand, when the charging voltage of time constant circuit 70 or the base potential of transistor $Q_j$ decreases, transistor $Q_s$ is immediately driven into the OFF condition. Thus, transistor $Q_s$ can stably change between the ON and OFF conditions around a threshold level of transistor $Q_s$.

This invention can be so modified that control circuit means 34 works in connection with only power amplifying stage 12. This modification is obtained by FIG. 2, 3 or 4 without capacitor 72. Therefore resistors 74 and 78 of FIG. 2 or 3 just work as a biasing circuit not having any time constant for transistor $Q_s$ of electronic switch means 26. As a result, the muting operation of the power amplifier is always accurately effected or released.

Additional advantages and modifications will readily occur to those skilled in the art. The invention in its broader aspects is therefore not limited to the specific details, representative apparatus, and illustrative examples shown and described. Accordingly, departures may be made from such detail without departing from the spirit or scope of applicant's general inventive concept.

What is claimed is:

1. A power amplifier comprising:
   an input circuit means;
   a power supply having first and second power source terminals;
   a preamplifying stage having at least one transistor with first, second and third electrodes, said first electrode being connected to said input circuit means;
   a resistance load, said second electrode being connected to said first power source terminal through said resistance load, and said third electrode being connected to said second power source terminal;
   a power amplifying stage connected at its input to said second electrode of said at least one transistor;
   an electrode switch means connected between said third electrode of said at least one transistor and said second power source terminal, and having a control terminal;
   resistance means connected between said third electrode of said at least one transistor and said first power source terminal, in parallel with said at least one transistor and said resistance load; and
   control circuit means connected to said control terminal of said electronic switch means for applying a muting signal to said electronic switch means in the event excessive input signals are applied to the power amplifier or overloading occurs to prevent damage to the power amplifier.

2. A power amplifier circuit according to claim 1 wheren said control circuit means applies the muting signal to said electronic switch means to disconnect said power supply from the power amplifier circuit for a predetermined period of time after said power supply is activated.

3. A power amplifier circuit according to claim 2 wherein said control circuit means includes a time constant circuit charged by said power supply, and wherein the muting signal is applied to said electronic switch means when the voltage of said time constant circuit is less than a predetermined level.

4. A power amplifier circuit according to claim 3 wherein the voltage of said time constant circuit is directly applied to said electronic switch means when it is less than the predetermined level.

5. A power amplifier circuit according to claim 3 wherein said control circuit means further includes a Schmitt circuit connected to said time constant circuit, and wherein the muting signal is supplied through said Schmitt circuit.

6. A power amplifier circuit according to claim 1 wherein said control circuit means applies the muting signal to said electronic switch means when a current in excess of a predetermined level flows through said power amplifying stage.

7. A power amplifier circuit according to claim 6 wherein said control circuit means includes a biasing circuit, and wherein the muting signal is supplied to said electronic switch means when the voltage of said biasing circuit is reduced in response to a current in excess of a predetermined level.

8. A power amplifier circuit according to claim 7 wherein said control circuit means further includes a by-pass circuit connected between said biasing circuit and said power amplifying stage to reduce the terminal voltage of said biasing circuit when a current in excess of a predetermined level current flows through said power amplifying stage.

9. A power amplifier circuit according to claim 1 wherein said control circuit means supplies the muting signal to said electronic switch means during a predetermined period of time after said power supply is activated and when a current in excess of a predetermined level flows through said power amplifying stage.

10. A power amplifier circuit according to claim 9 wherein said control circuit means includes a time constant circuit charged by said power supply and discharged by said power amplifying stage, and wherein the muting signal is supplied to said electronic switch means when the voltage of said time constant circuit is less than a predetermined level.

11. A power amplifier circuit according to claim 1 wherein said electronic switch means is a transistor having first second and third electrodes, said first electrode being coupled to said control circuit means, and said second electrode being coupled to said third electrode of said at least one transistor, and said third electrode being coupled to the second power source terminal.

12. A power amplifier according to claim 1 wherein said power amplifying stage includes two opposite conductivity transistors for amplifying positive and negative half cycles of input signal, a driver transistor having a collector connected in common to the bases of said two transistors and an active load transistor connected between said collector of said driver transistor and said first power source terminal, and wherein the power amplifier further comprises a second electronic switch means connected between said base of said active load transistor and said control circuit means.

* * * * *